(12) United States Patent
Tomita (10) Patent No.: US 9,383,528 B2
(45) Date of Patent: Jul. 5, 2016

(54) LIGHT-RECEIVING MODULE

(75) Inventor: Isao Tomita, Tokyo (JP)

(73) Assignee: NEC CORPORATION, Tokyo (JP)

( * ) Notice: Subject to any disclaimer, the term of this patent is extended or adjusted under 35 U.S.C. 154(b) by 317 days.

(21) Appl. No.: 14/343,100

(22) PCT Filed: Jun. 12, 2012

(86) PCT No.: PCT/JP2012/003806
§ 371 (c)(1),
(2), (4) Date: Mar. 6, 2014

(87) PCT Pub. No.: WO2013/035227
PCT Pub. Date: Mar. 14, 2013

(65) Prior Publication Data
US 2014/0217270 A1 Aug. 7, 2014

(30) Foreign Application Priority Data
Sep. 9, 2011 (JP) .................. 2011-196962

(51) Int. Cl.
*G01J 1/04* (2006.01)
*G01J 3/50* (2006.01)
(Continued)

(52) U.S. Cl.
CPC *G02B 6/42* (2013.01); *G02B 6/122* (2013.01); *G02B 6/4204* (2013.01); *G02B 6/4214* (2013.01); *H01L 31/02325* (2013.01)

(58) Field of Classification Search
USPC .......... 250/221, 227.11, 227.14, 226, 227.18, 250/227.24, 227.27, 227.28, 227.2, 227.21; 340/500, 540, 541, 545.3, 552, 340/555–557; 359/515, 520, 546, 577, 831, 359/833, 834, 837, 838, 839, 840, 850, 851, 359/855–857, 861; 385/15–52, 100–114; 398/39, 43–103, 135–172, 202–214
See application file for complete search history.

(56) References Cited

U.S. PATENT DOCUMENTS 6,535,670 B1 * 3/2003 Takei ................. G02B 6/12004
385/14
7,436,875 B2 * 10/2008 Miura .................. G02B 6/3821
372/101

(Continued)

FOREIGN PATENT DOCUMENTS

| CN | 1510448 A | 7/2004 |
| CN | 1670557 A | 9/2005 |

(Continued)

OTHER PUBLICATIONS

Chinese Office Action for CN Application No. 201280043411.8 mailed on Mar. 10, 2015 with English Translation.
(Continued)

*Primary Examiner* — Pascal M Bui Pho (57) ABSTRACT

A light-receiving module of the present invention includes: a lens collimating signal light entering from an optical fiber; a PLC (Planar Lightwave Circuit) where the signal light emitted by the lens enters; a mirror having a function of reflecting and transmitting the signal light emitted by the PLC; and a light-receiving element receiving the signal light reflected by the mirror. The mirror also has a function of transmitting light from the opposite direction to a direction to transmit the signal light emitted by the PLC. The module further includes a dummy mirror which reflects external light entering from outside in a direction toward the PLC, passes the reflected external light through the mirror from the opposite direction to the signal light transmission direction, causes the light to enter the PLC, and guides the light to the optical fiber via the PLC.

9 Claims, 5 Drawing Sheets

(51) Int. Cl.
*G06M 7/00* (2006.01)
*G02B 6/42* (2006.01)
*H01L 31/0232* (2014.01)
*G02B 6/122* (2006.01)

(56) References Cited

U.S. PATENT DOCUMENTS 7,512,291 B2* 3/2009 Mendoza ............. G01D 5/3583
 385/10
2005/0074213 A1* 4/2005 Lin .................... G02B 6/29362
 385/88
2011/0280514 A1* 11/2011 Omura ............... G02B 6/29361
 385/27
2013/0112858 A1* 5/2013 Rosiewicz ........ G01M 11/3181
 250/227.28

FOREIGN PATENT DOCUMENTS

JP 63-139307 A 6/1988
WO 2010140185 A1 12/2010

OTHER PUBLICATIONS

International Search Report for PCT Application No. PCT/JP2012/003806, mailed on Sep. 18, 2012.

\* cited by examiner

LIGHT-RECEIVING MODULE

This application is a National Stage Entry of PCT/JP2012/003806 filed on Jun. 12, 2012, which claims priority from Japanese Patent Application 2011-196962 filed on Sep. 9, 2011, the contents of all of which are incorporated herein by reference, in their entirety.

TECHNICAL FIELD

The present invention relates to a light-receiving module, more specifically, relates to a light-receiving module used for optical communication.

BACKGROUND ART

In recent years, increase of transmission capacity has been required due to sharp increase of communication traffic. An optical communication module is a key device of an optical network system. As a system becomes high-speed and large-capacity, it is required to make an optical communication module small-sized and high-speed.

A light-receiving module for optical communication generally has an optical fiber that transmits optical signals, a PD (photodiode) that converts the optical signals transmitted through a transmission path into electric current, and a TIA (transimpedance amplifier) that performs impedance conversion and amplifies the current signals and outputs as voltage signals, which are packaged in a ceramic package.

There are an increasing number of techniques for making an optical communication module high-speed by making the inside of the module multi-channel, for example, realizing 40 Gbps with 10 Gbps×4 or realizing 100 Gbps with 25 Gbps×4.

In order to make a light-receiving module high-speed, it is necessary to mount electric components on the same board and make GND common for decrease of loss of electric signals, and make the interconnection length between components as short as possible. Thus, as a multi-channel high-speed light-receiving module like a digital coherent receiver module, a structure that bends multi-channel interference signal light generated on a PLC and causes the light to enter into a PD mounted on the same carrier as a TIA and a ceramic circuit board is widely known.

Further, as a light-receiving module, there is a structure that is equipped with a monitoring PD and monitors the level of signals via a tap prism to check the intensity of transmitted signal light. In the case of inserting an optical component such as a prism in an optical path, it is general to use a collimation optical system, because component characteristics do not become stable when light is diffusing or converging.

Since a light-receiving module does not have an element serving as a light source, it is general to cause light to enter from the side of an optical fiber, and actively implement while checking a PD current value. Depending on the types and structures of the components mounted inside, it is possible to use, as a light source, feeble light of a PD that illuminates when PD forward current is flown, and thereby determine a position to mount a lens for collimating light.

Patent Document 1: Japanese Unexamined Patent Application Publication No. 1988-139307

However, a light-receiving module structured to branch signal light into multiple channels has a problem that, from feeble light obtained by PD forward current, a sufficient amount of light to monitor cannot be obtained due to propagation loss up to the incident end. Therefore, it is considered to implement by causing a laser beam to enter in a direction opposite to an optical path and monitoring a large amount of dummy light. However, in a light-receiving module having a structure that an optical fiber is placed outside a package, there is no way to cause the dummy light to enter because the exterior wall of the package blocks the dummy light. That is to say, there is a problem that it is difficult to position a lens in a light-receiving module.

In Patent Document 1, a technique of regulating an optical axis by providing a dummy light source in a light-emitting module structured so that a light ray from a light source directly enters into a lens system is described as a related technique. However, since the exterior wall of a package becomes an obstacle in a light-receiving module as mentioned above, it is difficult to apply the technique described in Patent Document 1.

SUMMARY

Accordingly, an object of the present invention is to solve the abovementioned problem that it is difficult to position a lens in a light-receiving module.

A light-receiving module as an exemplary embodiment of the present invention is a light-receiving module including: a lens configured to collimate signal light entering from an optical fiber; a PLC (Planar Lightwave Circuit) where the signal light collimated and emitted by the lens enters; a mirror having a function of reflecting and transmitting the signal light emitted by the PLC in a predetermined direction; and a light-receiving element configured to receive the signal light reflected by the mirror, wherein the mirror also has a function of transmitting light from a direction opposite to a direction of transmission of the signal light emitted by the PLC, the light-receiving module further including a dummy mirror on an emission side of the mirror where the signal light transmitted by the mirror is emitted, the dummy mirror being configured to reflect external light entering from outside in a direction toward the PLC, pass the reflected external light through the mirror from the direction opposite to the direction of transmission of the signal light, cause the light to enter the PLC, and guide the light to the optical fiber via the PLC.

Further, a method for regulation of a light-receiving module as another exemplary embodiment of the present invention is a method of a light-receiving module, wherein the light-receiving module includes: a lens configured to collimate signal light entering from an optical fiber; a PLC (Planar Lightwave Circuit) where the signal light collimated and emitted by the lens enters; a mirror having a function of reflecting and transmitting the signal light emitted by the PLC in a predetermined direction; and a light-receiving element configured to receive the signal light reflected by the mirror;

wherein the mirror also has a function of transmitting light from a direction opposite to a direction of transmission of the signal light emitted by the PLC; and wherein the light-receiving module further includes a dummy mirror on an emission side of the mirror where the signal light transmitted by the mirror is emitted, the dummy mirror being configured to reflect external light entering from outside in a direction toward the PLC, pass the reflected external light through the mirror from the direction opposite to the direction of transmission of the signal light, cause the light to enter the PLC, and guide the light to the optical fiber via the PLC, the method for regulation of the light-receiving module, including:

causing the external light to enter into the dummy mirror; and detecting the external light from an optical-fiber side and adjusting a position of a component depending on a detected value.

With the configurations described above, the present invention facilitates positioning of a lens in a light-receiving module.

EXEMPLARY EMBODIMENTS

First Exemplary Embodiment

Figure 1:
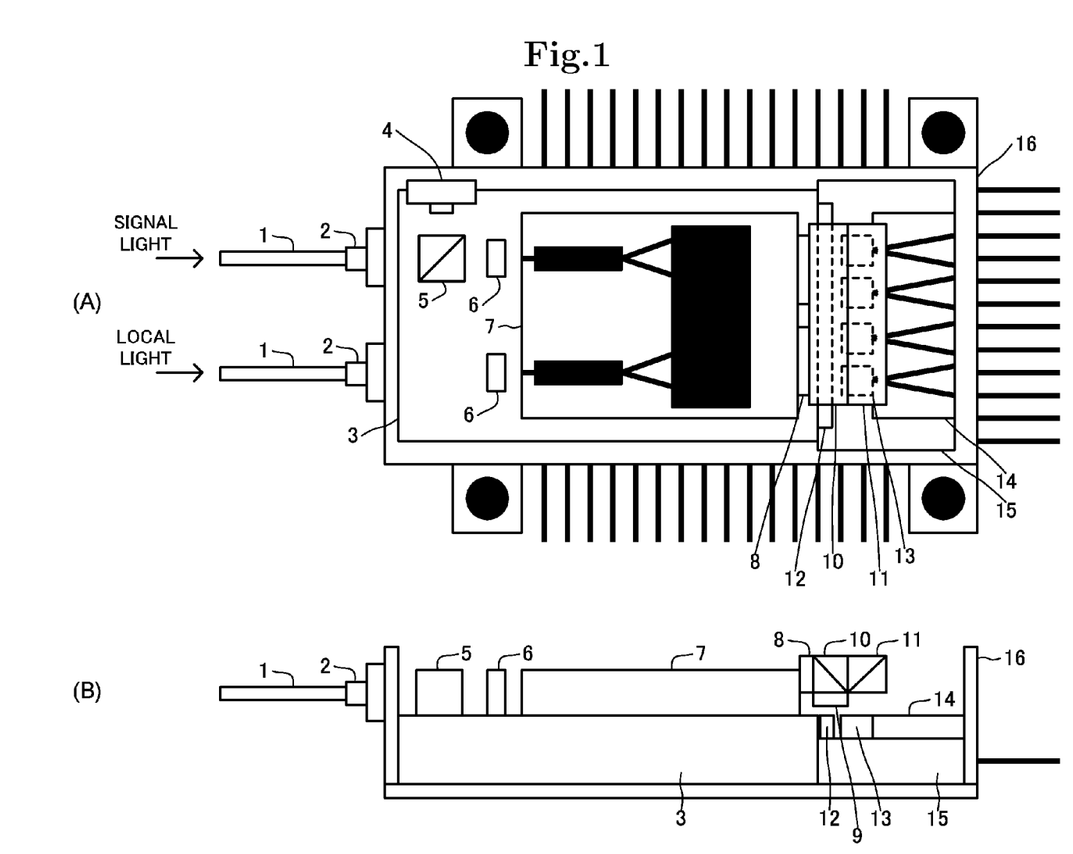
FIGS. 1A and 1B are diagrams showing a configuration of a light-receiving module in a first exemplary embodiment of the present invention.

Referring to FIGS. 1A to 5, a first exemplary embodiment of the present invention will be described. FIG. 1A is a top view of a light-receiving module in this exemplary embodiment, and FIG. 1B is a side view of the same. As shown in FIGS. 1A and 1B, the light-receiving module is configured with the periphery surrounded by a ceramic package 16. To the light-receiving module, optical fibers 1 for causing signal light and local light to enter into the package 16, respectively, are connected. The light-receiving module includes lenses 2 for collimating the light entering from the optical fibers 1, respectively.

The light-receiving module has, inside the package 16, a tap prism (a signal-light branching means) 5 for causing part of the signal light collimated by the lens 2 to branch off, a PD (photodiode) (a signal light level detecting element) 4 that, in response to entry of the signal light caused to branch off by the tap prism 5, detects and monitors a light-receiving level, condenser lenses 6 that concentrate the collimated light of the signal light transmitted through the tap prism 5 and the collimated light of the local light onto a PLC 7, respectively, the PLC (planar lightwave circuit) 7 that has a function of a coherent mixer, and an element carrier 3 that supports the abovementioned components.

Further, the light-receiving module has, inside the package 16, a lens 8 that collimates interference light emitted from the PLC 7, a mirror 10 that changes the optical path of the interference light, a PD (photodiode) (a light-receiving element) 12 that receives interference signals of the signal light and the local light emitted from the PLC 7 and converts the light into electric current, and a lens 9 that couples the interference light to the PD 12. Moreover, the light-receiving module has, inside the package 16, a TIA (transimpedance amplifier) 13 that converts the electric current outputted from the PD 12 into voltage, a circuit board 14, a board carrier 15 that supports the PD 12 and so on, and a dummy mirror 11 for causing light to enter into the PLC 7 from outside the package 16. A digital coherent receiver module (light-receiving module) for DP-QPSK is thus configured.

In a DP-QPSK light-receiving module, signal light is separated into TE components and TM components and subjected to delay interference with local light, whereby outputs for eight ports of two pairs×4 are obtained. By causing the differential TIA 13 to receive the outputs, the modulated signal light transmitted through the transmission path is demodulated. For obtaining optical outputs for eight ports of light emitted from the PLC 7, it is necessary to implement eight PDs and four TIAs for signal demodulation inside the package 16. Because high-frequency characteristics become worse as a distance between the PD and the TIA becomes longer, it is general to employ a structure that has favorable electrical characteristics by implementing the PDs 12 and the TIAs 13 as close as possible to each other. The PDs 12 and the TIAs 13 are placed adjacent to each other, and light emitted from the PLC 7 is bent so that the light emitted from the PLC 7 is received by the eight PDs 12.

Figure 2:
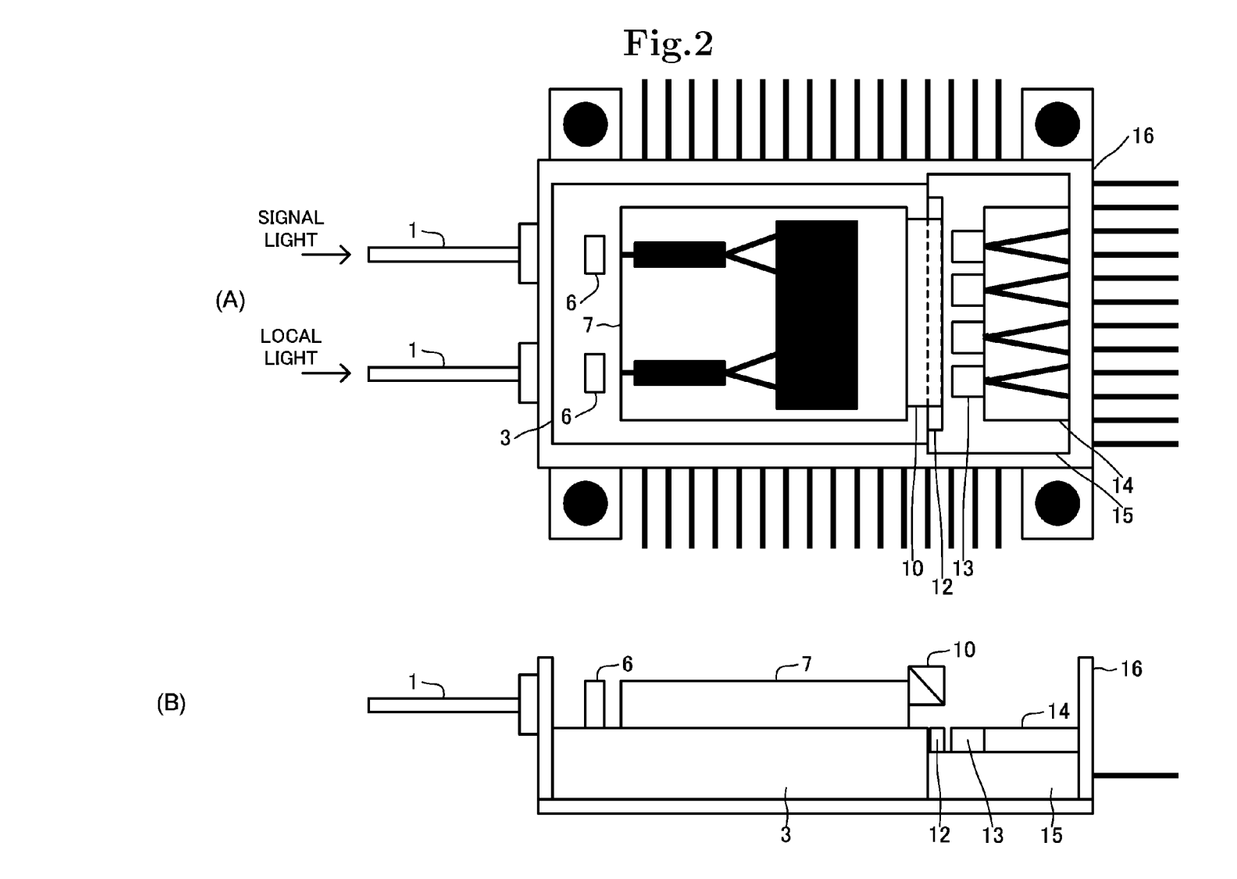
FIGS. 2A and 2B are diagrams showing a configuration of a light-receiving module relating to the present invention.

FIGS. 2A and 2B show the configuration of another light-receiving module relating to the present invention. Unlike the other light-receiving module shown in FIGS. 2A and 2B, the light-receiving module according to the present invention has the monitoring PD 4 and the tap prism 5 on a side before the light enters into the PLC 7, for monitoring the level of signal light. The tap prism 5 causes part of the signal light to branch off in a direction of 90 degrees with respect to the incident direction, and the monitoring PD 4 monitors the light level of the signal light. In order that the tap prism 5 causes a certain proportion of the light to branch off, an optical system on the incident side of the PLC 7 needs to be a collimation optical system. The lenses 2 that collimate incident light are mounted outside the package 16, and the condenser lenses 6 (second lenses) are mounted on a side after the light is transmitted through the tap prism 5.

In order to fix the lenses 2 and the optical fibers 1 mounted outside the package 16 with high accuracy, it is necessary to cause light to enter and propagate through the PLC 7 in a direction opposite to signal propagation, and adjust the position of the condenser lenses 6 while monitoring the light collimated by the condenser lenses 6 from outside the package 16. Therefore, the condenser lenses 6 are mounted in a movable state so that the positions thereof can be adjusted.

However, the exterior wall of the package 16 becomes an obstacle in a state that the components are packaged in the package 16, and hence, there has been no way to cause light to enter into the PLC 7 so far.

Accordingly, the present invention enables light to enter into the PLC 7 from outside the package 16, by providing the mirror 10 that reflects interference light emitted from the PLC 7 toward the PD 12 with a transmission band, and bonding the dummy mirror 11 that reflects the interference light emitted from the PLC 7 toward the upper face to the mirror 10. To be specific, referring to FIGS. 3 and 4, the mirror 10 and the dummy mirror 11 will be described.

Figure 3:
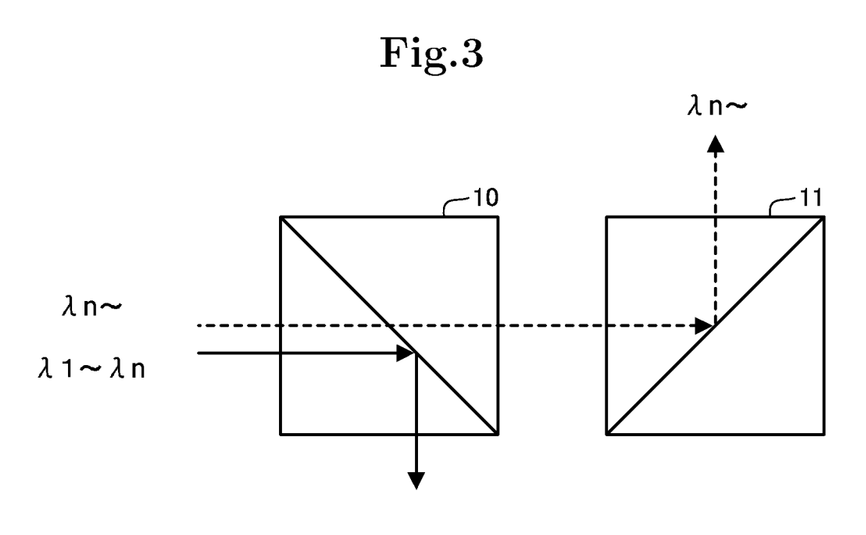
FIG. 3 is a diagram showing a configuration of part of the light-receiving module disclosed in FIG. 1.

The mirror 10 has a characteristic of bending and reflecting light of $\lambda 1$ to $\lambda n$ of a signal wavelength band in a direction of 90 degrees with respect to a light incident direction that is a direction toward the mirror 10 from the optical fiber 1 (i.e., in FIGS. 3 and 4, a downward direction where the PD 12 is placed) as shown by a solid-line arrow in FIG. 3, and transmitting light of the other wavelength band ($\lambda n$ and more) in the incident direction as shown by a dashed-line arrow in FIG. 3. Moreover, the mirror 10 has a characteristic of transmitting light in a direction opposite to the abovementioned direction, namely, transmitting light coming from a direction opposite to the incident direction toward the optical fiber 1.

The dummy mirror 11 is placed adjacent to the mirror 10, in the rear of the mirror 10 along the abovementioned incident direction, and can be freely attached to and detached from the light-receiving module. The dummy mirror 11 has a characteristic of bending and reflecting the light in the transmission band of the mirror 10 (i.e., the light in the wavelength band λn and more) at 90 degrees. To be specific, the dummy mirror 11 bends and reflects the light at 90 degrees upward (a direction opposite to the reflection direction of the mirror 10) with respect to the abovementioned incident direction as shown by the dashed-line arrow in FIG. 3. Thus, the mirror 10 and the dummy mirror 11 are placed so that the reflection directions are 180 degrees different from each other.

Figure 4:
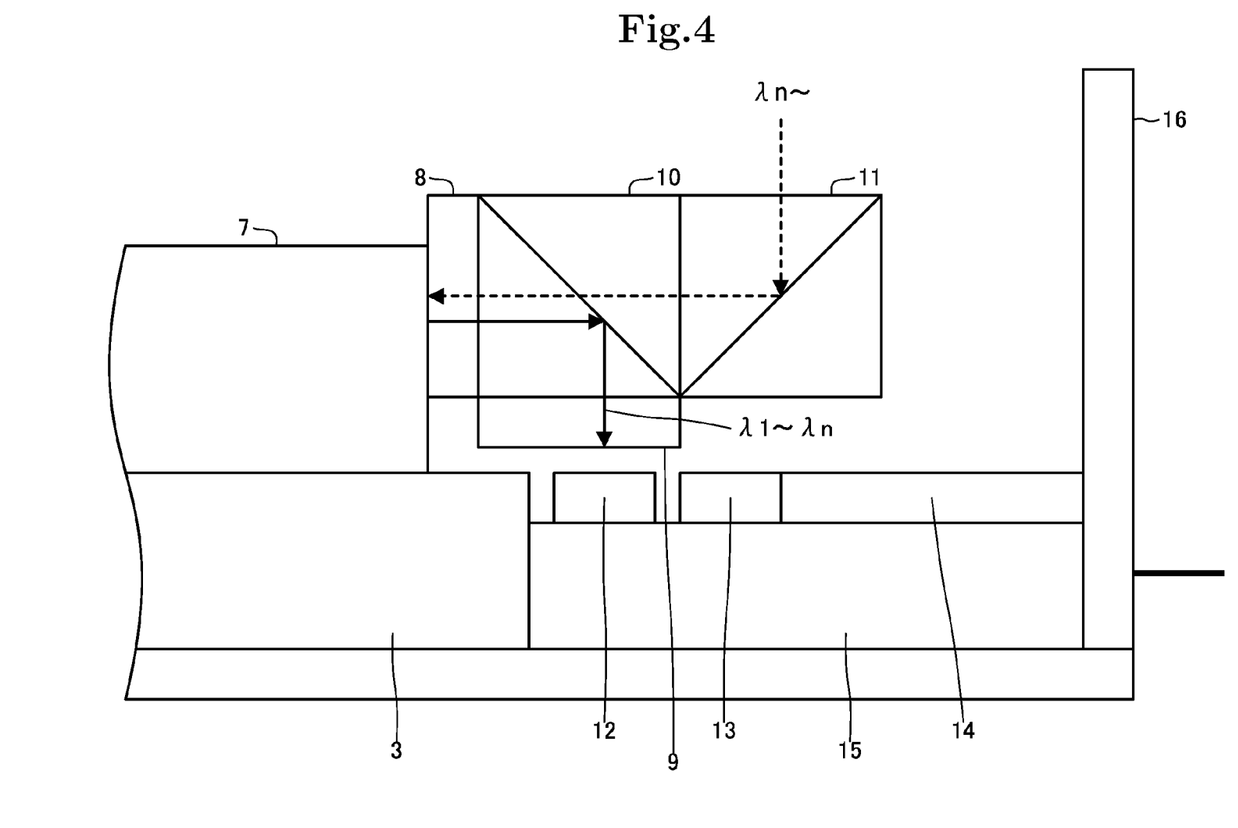
FIG. 4 is a diagram showing a configuration of part of the light-receiving module disclosed in FIG. 1.

For implementing the optical fibers 1 and the lenses 2 outside of the package 16 of the abovementioned light-receiving module, firstly, collimation light that is external light (dummy light) is caused to enter into the dummy mirror 11 from the upper face side of the package 16 as shown by a dashed-line arrow in FIG. 4. Then, the external light is reflected by the dummy mirror 11 toward the mirror 10 and transmitted by the mirror 10, and enters into the PLC 7. Because the external light propagating through the waveguide path of the PLC 7 propagates to the optical fibers 1, the external light is detected and monitored in the optical fibers 1 placed outside the package 16. Depending on the detected value of the monitored external light, the positions of the components configuring the light-receiving module are adjusted. For example, by providing the optical fiber 1 with a camera, the position of the condenser lens 6 placed between the tap prism 5 and the PLC 7 is adjusted so that the optical input power of the external light monitored by the camera becomes the maximum. Moreover, by moving the camera along the axial direction of the optical fiber 1, the position of the condenser lens 6 placed between the tap prism 5 and the PLC 7 is adjusted so that the size of the light becomes constant, namely, the light becomes collimation light.

Figure 5:
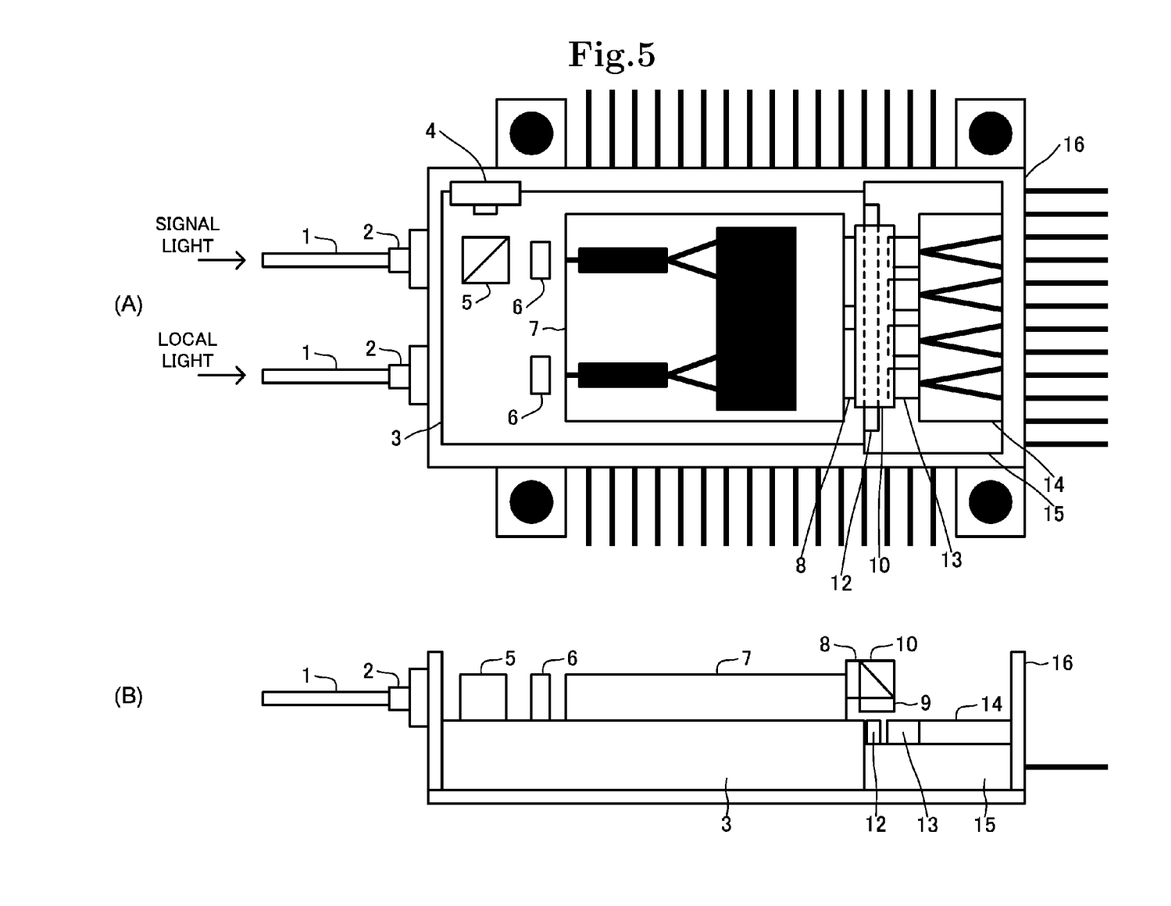
FIG. 5 is a diagram showing another configuration of the light-receiving module in the first exemplary embodiment of the present invention.

By adjusting the light-receiving module in the above manner, it is possible to realize a collimation optical system on a side where signal light enters. Then, interference light of signal light and local light entering from the optical fiber 1 is reflected by the mirror 10 and caused to enter into the PD 12 as shown by a solid-line arrow in FIG. 4, whereby a function as a light-receiving module is fulfilled. The light-receiving module may be used in a state that the dummy mirror 11 is removed as shown in FIG. 5 after the positions of the lenses 6 are adjusted in the abovementioned manner. Although a case of adjusting the positions of the lenses 6 placed between the tap prism 5 and the PLC 7 has been described above as an example, the position of the other components may be adjusted to increase the accuracy of the light-receiving module.

<Supplementary Notes>

The whole or part of the exemplary embodiments disclosed above can be described as the following supplementary notes. The outline of configurations of a light-receiving module and a method for regulation of the same according to the present invention will be described below. However, the present invention will not be limited to the following configurations.

(Supplementary Note 1)

A light-receiving module including: a lens configured to collimate signal light entering from an optical fiber; a PLC (Planar Lightwave Circuit) where the signal light collimated and emitted by the lens enters; a mirror having a function of reflecting and transmitting the signal light emitted by the PLC in a predetermined direction; and a light-receiving element configured to receive the signal light reflected by the mirror, wherein the mirror also has a function of transmitting light from a direction opposite to a direction of transmission of the signal light emitted by the PLC, the light-receiving module further including a dummy mirror on an emission side of the mirror where the signal light transmitted by the mirror is emitted, the dummy mirror being configured to reflect external light entering from outside in a direction toward the PLC, pass the reflected external light through the mirror from the direction opposite to the direction of transmission of the signal light, cause the light to enter the PLC, and guide the light to the optical fiber via the PLC.

(Supplementary Note 2)

The light-receiving module according to Supplementary Note 1, including:

a signal light level detecting element configured to detect a light-receiving level of the signal light;

a signal-light branching means for causing part of the signal light collimated and emitted by the lens to branch off and causing the branching-off part to enter into the signal light level detecting element; and a second lens configured to concentrate the signal light transmitted by the signal light branching means onto the PLC, wherein the second lens is mounted so that a position thereof can be adjusted.

(Supplementary Note 3)

The light-receiving module according to Supplementary Note 1 or 2, wherein the mirror has a function of reflecting signal light of a preset wavelength range and transmitting signal light of a preset other wavelength range and the external light.

(Supplementary Note 4)

The light-receiving module according to Supplementary Note 3, wherein:

the mirror has a function of bending and reflecting the signal light of the preset wavelength range at 90 degrees with respect to an incident direction; and the dummy mirror has a function of bending and reflecting the signal light transmitted by the mirror at 90 degrees with respect to the incident direction, in a direction opposite to a direction of reflection by the mirror.

(Supplementary Note 5)

The light-receiving module according to any of Supplementary Notes 1 to 4, wherein the dummy mirror is mounted so as to be freely attached to and detached from the light-receiving module.

(Supplementary Note 6)

A method for regulation of a light-receiving module, wherein the light-receiving module includes: a lens configured to collimate signal light entering from an optical fiber; a PLC (Planar Lightwave Circuit) where the signal light collimated and emitted by the lens enters; a mirror having a function of reflecting and transmitting the signal light emitted by the PLC in a predetermined direction; and a light-receiving element configured to receive the signal light reflected by the mirror;

wherein the mirror also has a function of transmitting light from a direction opposite to a direction of transmission of the signal light emitted by the PLC; and wherein the light-receiving module further includes a dummy mirror on an emission side of the mirror where the signal light transmitted by the mirror is emitted, the dummy mirror being configured to reflect external light entering from outside in a direction toward the PLC, pass the reflected external light through the mirror from the direction opposite to the direction of transmission of the signal light, cause the light to enter the PLC, and guide the light to the optical fiber via the PLC, the method for regulation of the light-receiving module, including:

causing the external light to enter into the dummy mirror; and detecting the external light from an optical-fiber side and adjusting a position of a component depending on a detected value.

(Supplementary Note 7)

The method for regulation of the light-receiving module according to Supplementary Note 6, wherein the light-receiving module includes: a signal light level detecting element configured to detect a light-receiving level of the signal light; a signal-light branching means for causing part of the signal light collimated and emitted by the lens to branch off and causing the branching-off part to enter into the signal light level detecting element; and a second lens configured to concentrate the signal light transmitted by the signal light branching means onto the PLC, the method for regulation of the light-receiving module, including adjusting a position of the second lens depending on the detected value of the external light detected from the optical-fiber side.

(Supplementary Note 8)

The method for regulation of the light-receiving module according to Supplementary Note 7, including detecting power of the external light from the optical-fiber side and adjusting the position of the second lens so that the power becomes the maximum.

(Supplementary Note 9)

The method for regulation of the light-receiving module according to any of Supplementary Notes 6 to 8, including removing the dummy mirror after adjusting the position of the component of the light-receiving module.

Referring to the exemplary embodiments, the present invention has been described above, but is not limited to the exemplary embodiments. The configurations and details of the present invention can be modified in various manners that can be understood by one skilled in the art within the scope of the present invention.

The present invention is based upon and claims the benefit of priority from Japanese patent application No. 2011-196962, filed on Sep. 9, 2011, the disclosure of which is incorporated herein in its entirety by reference.

DESCRIPTION OF REFERENCE NUMERALS 1 optical fiber
2 lens
3 element carrier
4 PD
5 tap prism
6 condenser lens
7 PLC
8 lens
9 lens
10 mirror
11 dummy mirror
12 PD
13 TIA
14 circuit board
15 board carrier
16 package

What is claimed is:

1. A light-receiving module comprising: a lens configured to collimate signal light entering from an optical fiber; a PLC (Planar Lightwave Circuit) where the signal light collimated and emitted by the lens enters; a mirror having a function of reflecting and transmitting the signal light emitted by the PLC in a predetermined direction; and a light-receiving element configured to receive the signal light reflected by the mirror, wherein the mirror also has a function of transmitting light from a direction opposite to a direction of transmission of the signal light emitted by the PLC, the light-receiving module further comprising a dummy mirror on an emission side of the mirror where the signal light transmitted by the mirror is emitted, the dummy mirror being configured to reflect external light entering from outside in a direction toward the PLC, pass the reflected external light through the mirror from the direction opposite to the direction of transmission of the signal light, cause the light to enter the PLC, and guide the light to the optical fiber via the PLC.

2. The light-receiving module according to claim 1, comprising:
a signal light level detecting element configured to detect a light-receiving level of the signal light;
a signal-light branching unit for causing part of the signal light collimated and emitted by the lens to branch off and causing the branching-off part to enter into the signal light level detecting element; and
a second lens configured to concentrate the signal light transmitted by the signal light branching unit onto the PLC,
wherein the second lens is mounted so that a position thereof can be adjusted.

3. The light-receiving module according to claim 1, wherein the mirror has a function of reflecting signal light of a preset wavelength range and transmitting signal light of a preset other wavelength range and the external light.

4. The light-receiving module according to claim 3, wherein:
the mirror has a function of bending and reflecting the signal light of the preset wavelength range at 90 degrees with respect to an incident direction; and
the dummy mirror has a function of bending and reflecting the signal light transmitted by the mirror at 90 degrees with respect to the incident direction, in a direction opposite to a direction of reflection by the mirror.

5. The light-receiving module according to claim 1, wherein the dummy mirror is mounted so as to be freely attached to and detached from the light-receiving module.

6. A method for regulation of a light-receiving module,
wherein the light-receiving module comprises: a lens configured to collimate signal light entering from an optical fiber; a PLC (Planar Lightwave Circuit) where the signal light collimated and emitted by the lens enters; a mirror having a function of reflecting and transmitting the signal light emitted by the PLC in a predetermined direction; and a light-receiving element configured to receive the signal light reflected by the mirror;
wherein the mirror also has a function of transmitting light from a direction opposite to a direction of transmission of the signal light emitted by the PLC; and
wherein the light-receiving module further comprises a dummy mirror on an emission side of the mirror where the signal light transmitted by the mirror is emitted, the dummy mirror being configured to reflect external light entering from outside in a direction toward the PLC, pass the reflected external light through the mirror from the direction opposite to the direction of transmission of the signal light, cause the light to enter the PLC, and guide the light to the optical fiber via the PLC,
the method for regulation of the light-receiving module, comprising:
causing the external light to enter into the dummy mirror; and
detecting the external light from an optical-fiber side and adjusting a position of a component depending on a detected value.

7. The method for regulation of the light-receiving module according to claim 6,
wherein the light-receiving module comprises: a signal light level detecting element configured to detect a light-receiving level of the signal light; a signal-light branching unit for causing part of the signal light collimated and emitted by the lens to branch off and causing the branching-off part to enter into the signal light level detecting element; and a second lens configured to concentrate the signal light transmitted by the signal light branching unit onto the PLC, the method for regulation of the light-receiving module, comprising adjusting a position of the second lens depending on the detected value of the external light detected from the optical-fiber side.

8. The method for regulation of the light-receiving module according to claim 7, comprising detecting power of the external light from the optical-fiber side and adjusting the position of the second lens so that the power becomes the maximum.

9. The method for regulation of the light-receiving module according to claim 6, comprising removing the dummy mirror after adjusting the position of the component of the light-receiving module.

* * * * *